United States Patent [19]

Fluker

[11] Patent Number: 5,134,315
[45] Date of Patent: Jul. 28, 1992

[54] SYNCHRONOUS COUNTER TERMINAL COUNT OUTPUT CIRCUIT

[75] Inventor: Jon L. Fluker, Scarboro, Me.

[73] Assignee: National Semiconductor Corporation, Santa Clara, Calif.

[21] Appl. No.: 652,588

[22] Filed: Feb. 7, 1991

[51] Int. Cl.[5] .................. H03K 17/16; H03K 5/13
[52] U.S. Cl. ................... 307/443; 307/480; 307/594; 307/445
[58] Field of Search .......... 307/480, 591, 594, 272.2, 307/443, 445, 592

[56] References Cited

U.S. PATENT DOCUMENTS

| 4,757,214 | 7/1988 | Kobayashi | 307/445 |
|---|---|---|---|
| 5,019,724 | 5/1991 | McClure | 307/592 |
| 5,023,486 | 6/1991 | Gongwer | 307/272.2 |
| 5,036,221 | 7/1991 | Brucculeri et al. | 307/480 |

Primary Examiner—David Hudspeth
Assistant Examiner—Andrew Sanders
Attorney, Agent, or Firm—James W. Rose; Daniel H. Kane

[57] ABSTRACT

A synchronous counter flip flop circuit (20) incorporates a logical AND input circuit (22) having multiple inputs (24) and a first output (25) delivering a first count signal upon concurrence of count logic signals at count logic signal inputs (BIT0-BIT7) with a count enable clock signal at a count enable clock signal input (CET). A count delay circuit (30) is coupled to the first output (25) to provide a second output (32) in parallel with the first output (25) for delivering a delayed second count signal. A logical AND intermediate circuit coupling (34) having first and second inputs coupled respectively to the first and second outputs (25,32) provides a third output (35) delivering a third count signal which is a filtered intermediate terminal count signal (TC). An inverting output buffer circuit (26) provides a final inverted filtered terminal count signal ($\overline{TC}$) at the final terminal count output (28). The delay circuit (30) is constructed to provide a selected delay time interval longer than the transient duration time interval of decoding noise spikes for filtering out the decoding noise spikes at the logical AND intermediate circuit coupling (34).

8 Claims, 5 Drawing Sheets

SYNCHRONOUS COUNTER TERMINAL COUNT OUTPUT CIRCUIT

TECHNICAL FIELD

This invention relates to a new synchronous counter flip flop circuit having a terminal count output circuit that filters out transient duration decoding spikes from the terminal count signal output. The filtered terminal count signals may therefore be used as once per clock cycle clock signals or reset signals for other devices. More generally the invention provides a new output circuit for synchronous logical AND input circuits for filtering and eliminating from the output unwanted noise spikes caused by transient duration concurrent signal conditions at the "anded" inputs during a clock cycle.

BACKGROUND ART

A prior art synchronous counter flip flop circuit 10 is illustrated in the simplified logic circuit diagram of FIG. 1. A logical AND input circuit 12 has a plurality of inputs 14 including count logic signal inputs BIT-0-BIT7 and a count enable clock signal input CET. The logical AND input circuit 12 provides a first output 15 delivering a first count signal upon concurrence of count logic signals at the count logic signal inputs BIT-0-BIT7 with a count enable clock signal at the count enable clock signal input CET during a clock cycle. In the example of FIG. 1 using positive AND logic, concurrence of logic high potential level count logic signals with a logic high potential level count enable clock signal at the inputs 14 produces a logic high potential level first count signal at the first output 15.

An inverting output buffer circuit 16 is coupled to the first output 15 and provides a final terminal count output 18. The terminal count flip flop circuit operates by "decoding" the logic signal values of logic signals at the respective inputs 14. When all of the input signals at the inputs 14 are at logic high potential level, the device is in the terminal count condition and provides an intermediate terminal count signal TC of logic high potential level at the input of output buffer 16. The output buffer 16 provides the inverted terminal count signal $\overline{TC}$ at the terminal count output 18. The final terminal count signal $\overline{TC}$ is typically coupled to activate further cascaded counters generating, for example, more significant bits of a count total.

Two example prior art circuit implementations of the generalized logic circuit diagram of FIG. 1 are illustrated in FIGS. 2 and 3. In both examples, the inverting output buffer circuit 16 is a conventional inverting TTL output buffer circuit having a pullup transistor element Darlington transistor pair Q4,Q5, pulldown transistor element Q3 and a phase splitter transistor element Q2 coupled to control the conducting states of the pullup and pulldown transistor elements in opposite phase. In the example of FIG. 2 the logical AND input circuit 12 is provided by coupling the respective inputs 14 in parallel to the base node BPS of the phase splitter transistor element Q2. The parallel coupled inputs 14 provide an effective AND gate input circuit coupling delivering an intermediate terminal count signal TC, at the first output 15 and base node BPS of Q2, in the terminal count condition. The inverting output buffer 16 provides the final terminal count signal $\overline{TC}$ at the final terminal count output 18.

In the example of FIG. 3 the logical AND input circuit 12 is provided by a multiemitter transistor element QME1. The multiple emitters of QME1 are coupled respectively to the multiple inputs 14. The base node of QME1 is coupled to the high potential level power rail $V_{cc}$ through base resistor R3 while the collector node provides the first output 15 coupled to the base node BPS of phase splitter transistor element Q2.

A disadvantage of the conventional circuit implementations illustrated in FIGS. 2 and 3 is that unavoidable opposite edge skew of internal logic signals, and bit to bit variation of the internal logic signals may cause fortuitous and transient duration concurrence of high potential level conditions at the respective inputs 14. Such transient concurrent conditions or race conditions may cause unwanted low potential level noise spikes at the final terminal count output 18. Such noise spikes are referred to as decoding spikes. The probability of occurrence of decoding spikes increases in high speed TTL logic families which have the least propagation delay through the inverting output buffer circuit. These decoding noise spikes make the final terminal count output 18 unsuitable for driving edge triggered or a synchronous inputs and the final inverted terminal count signal $\overline{TC}$ is unsuitable for use as a clock signal or reset signal.

OBJECTS OF THE INVENTION

It is therefore an object of the present invention to provide a new synchronous counter flip flop circuit with a terminal count output circuit that filters out decoding spikes from the final terminal count output and "deglitches" the final terminal count signal.

Another object of the invention is to provide a terminal count output circuit for synchronous counters that generates final terminal count signals useful as clock signals and reset signals and suitable for driving edge triggered or a synchronous inputs.

More generally an object of the invention is to provide an output circuit for synchronous logical AND input circuits subject to transient duration concurrent conditions or race conditions at the AND inputs. The purpose of the invention is to filter out unwanted transient duration decoding noise spikes that may be caused by the race condition and to "deglitch" the final logic signal output.

DISCLOSURE OF THE INVENTION

In order to accomplish these results the invention provides a delay circuit coupled to the first output and first count signal from the logical AND input circuit. The delay circuit provides a second output in parallel with the first output for delivering a delayed second count signal a selected delay time interval after the first count signal.

According to the invention, these first and second outputs are coupled in a logical AND intermediate circuit coupling to provide a third output for delivering a filtered third count signal in response to the first and second count signals during a clock cycle. The filtered third count signal is an intermediate terminal count signal TC. The inverting output buffer circuit is coupled to the third output and provides a fourth output or final terminal count output for delivering the final inverted terminal count signal $\overline{TC}$.

In the preferred example embodiment the delay circuit is formed by a pair of delay transistor elements coupled in a double inversion sequence between the first output and the base node of the phase splitter transistor element of the inverting output buffer circuit. The multiple inputs of the logical AND input circuit are also coupled in parallel through the first output directly to the base node of the phase splitter transistor element. The first output from the logical AND input circuit and the second output from the delay circuit are therefore coupled in parallel at the base node of the phase splitter transistor element to provide a "wired" logical AND intermediate circuit coupling and a filtered third output.

According to an alternative embodiment, the logical AND input circuit is provided by a first multiemitter transistor element having multiple emitter leads coupled respectively to the multiple inputs. The collector node of the first multiemitter transistor element provides the first output. A second multiemitter transistor element also has multiple emitters coupled in parallel respectively to the plurality of inputs. The collector node of the second multiemitter transistor element is coupled to the delay circuit.

According to the preferred example the delay circuit is constructed to provide a selected delay time interval longer than the transient duration time interval of decoding noise spikes for filtering out the decoding noise spikes at the third output. A feature of the second AND function by the logical AND intermediate circuit coupling of the first and second outputs is that the inverting output buffer circuit cannot turn on until the first count signal and its delayed version provided by the second count signal are both at the logic high potential level. A decoding spike or noise spike of transient duration less than the delay time interval is therefore stopped and cannot propagate to the final terminal count output. The delay circuit and the logical AND intermediate circuit coupling filter out the narrow decoding spikes and deglitch the final terminal count signals $\overline{TC}$.

Other objects, features and advantages of the invention are apparent in the following specification and accompanying drawings.

DESCRIPTION OF PREFERRED EXAMPLE EMBODIMENTS AND BEST MODE OF THE INVENTION

Figure 1:
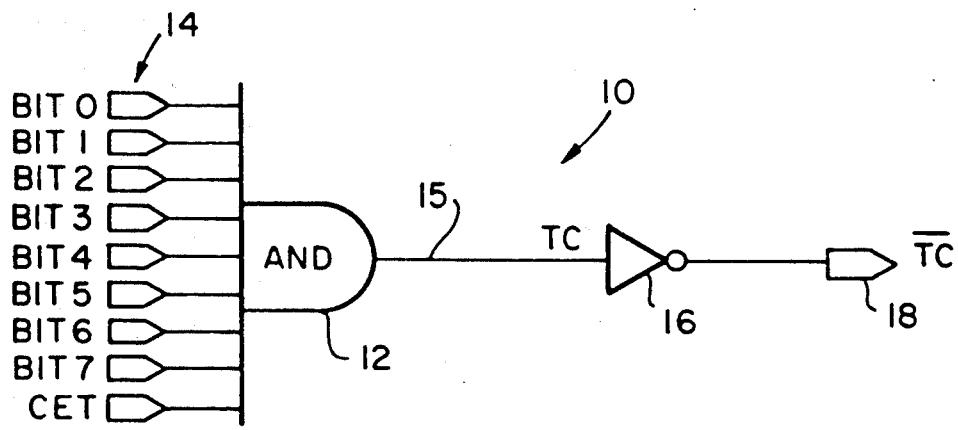
FIG. 1 is a generalized logic circuit diagram of a prior art synchronous counter flip flop circuit and more generally a synchronous logical AND input circuit and logic output circuit.
Figure 4:
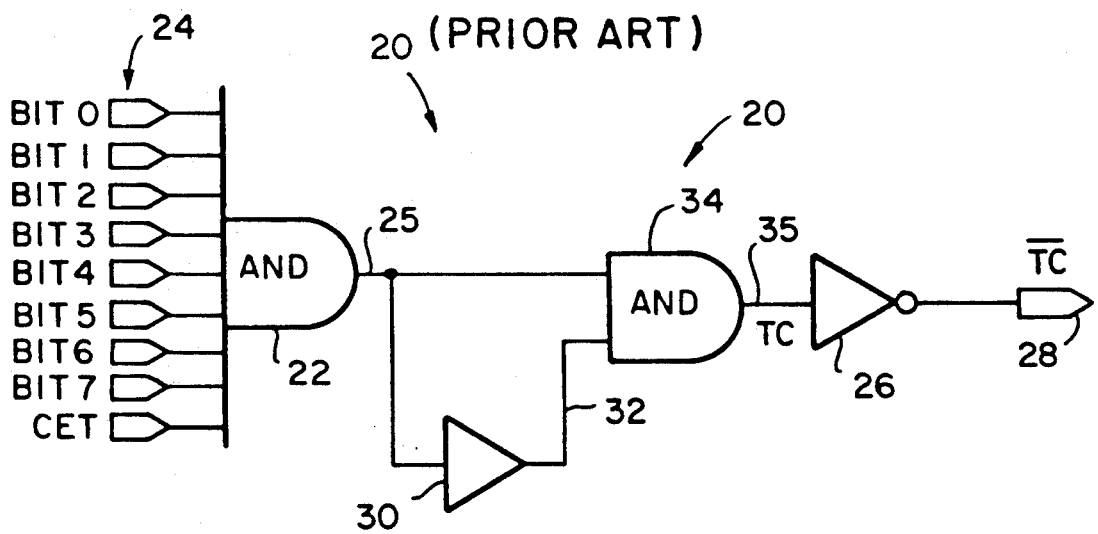
FIG. 4 is a generalized logic circuit diagram of a synchronous counter flip flop circuit according to the invention and more generally a synchronous logical AND input circuit and logic output circuit according to the invention.

A generalized logic circuit diagram of the synchronous counter flip flop circuit 20 with a terminal count output circuit according to the invention is illustrated in FIG. 4. The logic circuit of FIG. 4 is similar to FIG. 1 in providing a synchronous logical AND input circuit 22 with multiple inputs 24 and a first output 25 for delivering a first logic signal or first count signal. The logic circuit of FIG. 4 also has in common an inverting output buffer circuit 26 which provides the final terminal count output 28 for delivering an inverted final terminal count signal $\overline{TC}$.

In addition the logic circuit of FIG. 4 incorporates a delay circuit 30 coupled to the first output 25 providing a second output 32 in parallel with the first output 25 for delivering a delayed second logic signal or second count signal a selected time delay interval after the first count signal. The first and second outputs 25,32 are coupled together in a logical AND intermediate coupling 34 providing an effective intermediate logical AND gate with a third output 35 delivering a filtered intermediate terminal count signal TC coupled to the input of the inverting output buffer circuit 26.

The logic circuit of FIG. 4 normally maintains a high potential level final terminal count signal $\overline{TC}$ at the final terminal count output 28 in response to mixed signals of logic high and low potential levels at the inputs 24 to the logical AND input circuit 22. Each clock cycle of for example 10nS, a high potential count enable clock signal is applied at the count enable input CET. When all of the count logic signal inputs BIT0–BIT7 are at logic high potential level, a terminal count condition occurs and the final terminal count output signal $\overline{TC}$ at the final output 28 switches to a low potential level for the duration of the clock cycle. The logic circuit of FIG. 4 is also subject to the development of decoding spikes or noise spikes at the first output 25 as a result of spurious and transient concurrence of overlapping high potential levels at the inputs 24 referred to as a transient duration race condition. In the terminal count output circuit of FIG. 4 however spurious transient duration decoding signals at the first output 25 are eliminated before propagating to the output buffer circuit 26.

As hereafter described, the delay circuit 30 is constructed with a delay time interval longer than the transient duration time intervals of decoding spikes at the first output 25. As a result the narrow high potential level decoding spikes at the first output 25 are dissipated at the first input of the logical AND intermediate coupling 34 before the delayed version on the second output 32 arrives at the second input of the AND coupling 34. On the other hand, a normal high potential level terminal count condition on the first output 25 during a clock cycle is of sufficient duration so that it is still applied at the first output of effective AND gate 34 when the delayed version of the terminal count condition signal on the second output 32 arrives at the second input of effective AND gate 34. The logical AND intermediate coupling 34 therefore passes to the third output 35 only a filtered high potential level intermediate terminal count signal TC coupled to the input of inverting output buffer 26. The final terminal count output 28 therefore delivers a filtered low potential level final terminal count signal $\overline{TC}$.

Figure 5:
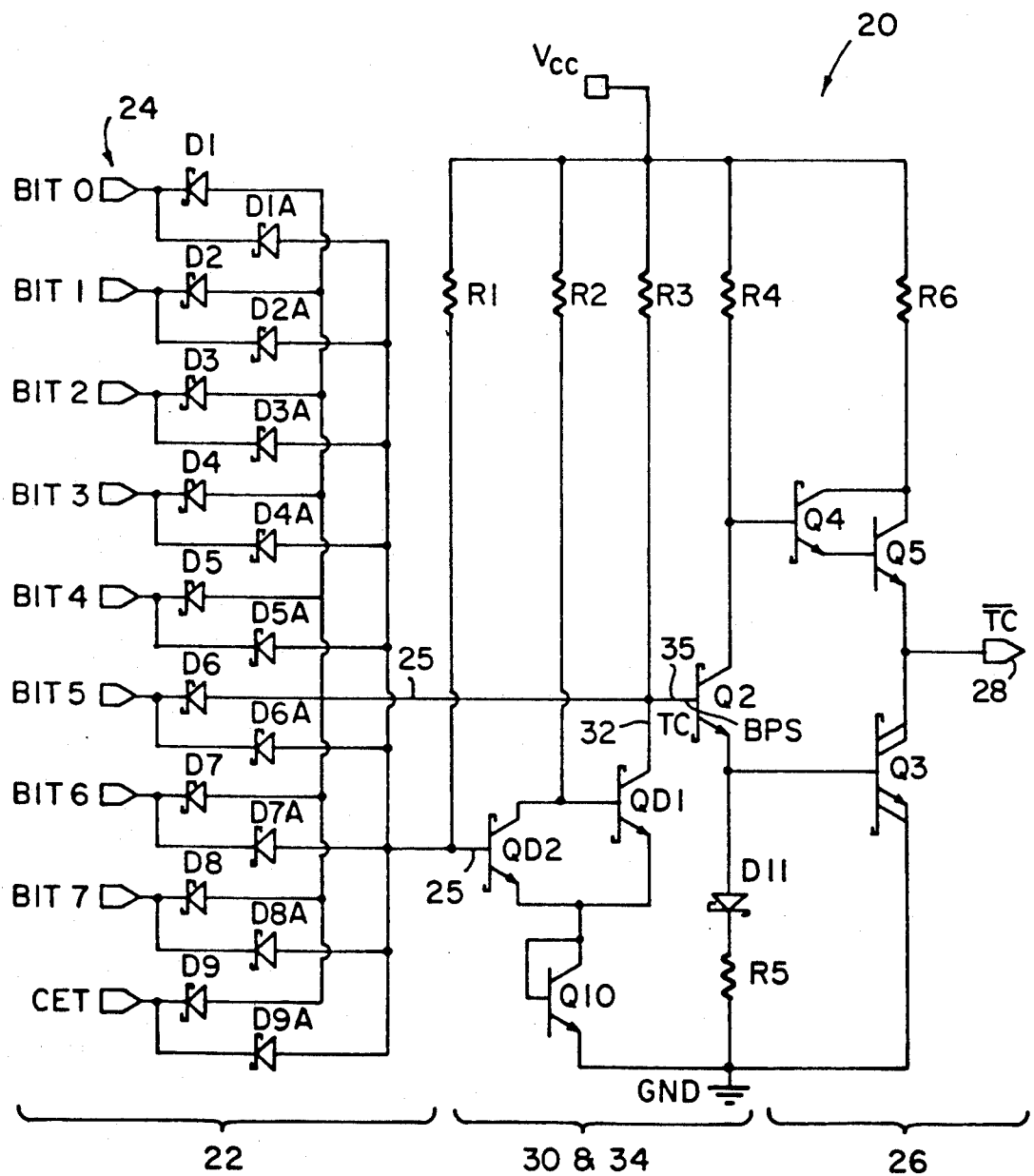
FIG. 5 is a detailed schematic circuit diagram of a preferred circuit implementation of the generalized logic circuit diagram of FIG. 4.

A preferred circuit implementation of the generalized logic circuit diagram of FIG. 4 is illustrated in FIG. 5 with corresponding elements designated by the same reference numerals and reference designations. The circuit implementation of FIG. 5 incorporates the same TTL inverting output buffer circuit 26 as the circuits of FIGS. 2 and 3 and the respective components are identified by the same reference designations. The logical AND input circuit 22 is provided by a wired AND coupling of the parallel inputs 24 through Schottky diodes D1-D9 to the first output 25. The first output 25 is effectively duplicated through a second set of Schottky diodes D1A-D9A for coupling to the input of the delay circuit 30.

The delay circuit 30 is provided by a first delay transistor element QD1 with a collector node coupled to the base node BPS of the phase splitter transistor element Q2 at the input of the inverting output buffer circuit 26. The emitter node of QD1 is coupled to the low potential rail GND through a base collector shorted (BCS) transistor element forming diode element Q10. The collector node of the first delay transistor element QD1 provides the second output 32. The delay circuit 30 also incorporates a second delay transistor element QD2 with a collector node coupled to the base node of the first delay transistor element QD1. The emitter node of QD2 is also coupled to the low potential power rail GND through diode element Q10. The base node of QD2 is coupled to the duplicated first input 25.

The logical AND intermediate coupling 34 is a wired AND coupling of the first and second inputs 25,32 at the base node BPS of phase splitter transistor element Q2 for parallel control of the conducting state of Q2. The base node BPS of phase splitter transistor element Q2 therefore constitutes the third output 35 delivering a filtered intermediate terminal count signal TC at the input to the output buffer circuit 26.

By the delay circuit arrangement of FIG. 5, both of the delay circuit transistor elements QD1 and QD2 and the phase splitter transistor element Q2 have the same turn on threshold of approximately $2V_{BE}$. With all of the inputs 24 at logic high potential level during a transient race condition, the phase splitter transistor element Q2 cannot turn on until the first delay transistor element QD1 turns off. QD1 cannot turn off until the second delay transistor element QD2 turns on according to the double inversion coupling. Because of the delay, narrow noise spikes and decoding spikes therefore cannot pass to the output buffer circuit 26. The design delay interval of the delay circuit 30 therefore determines which of the "all input high" events may pass to the output.

Figure 6:
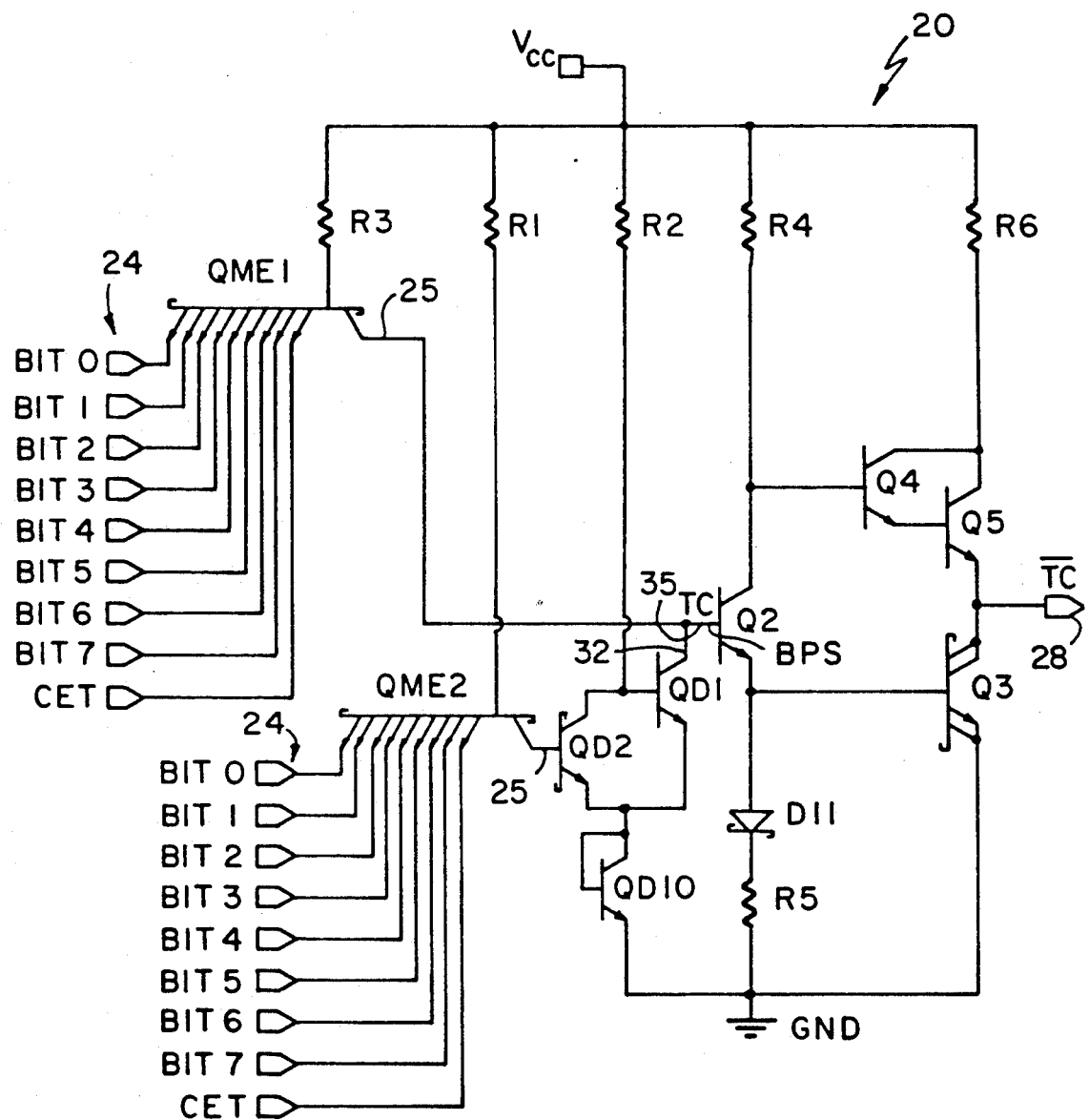
FIG. 6 is a detailed schematic circuit diagram of an alternative circuit embodiment of the generalized logic circuit diagram of FIG. 4.

An alternative embodiment of the logic circuit of FIG. 4 is illustrated in the schematic circuit diagram of FIG. 6. According to this embodiment, the logical AND input circuit 22 is provided by a first multiemitter transistor element QME1 with multiple emitters coupled to the multiple inputs 24 and a collector node providing the first output 25 coupled to the base node BPS of Q2. In addition the first output 25 is effectively duplicated through a second multiemitter transistor element QME2 having multiple emitters also coupled to the multiple inputs 24. The emitter node of QME2 provides the duplicated first output 25 for coupling to the input of the delay circuit 30.

Figure 2:
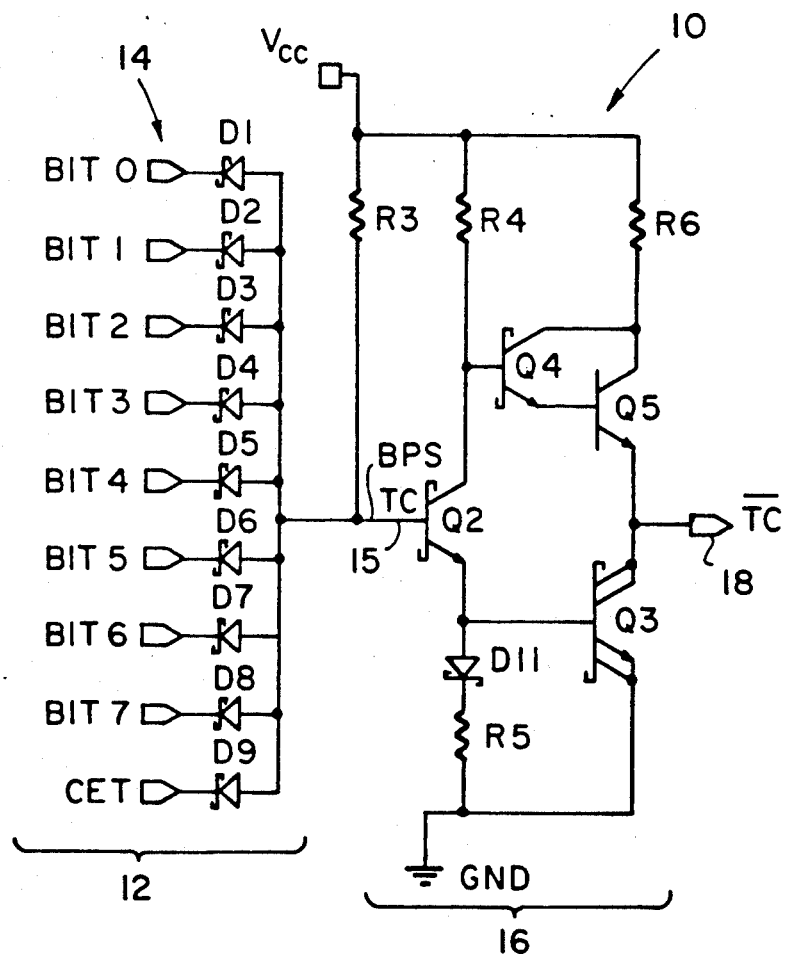
FIG. 2 is a detailed schematic circuit diagram of a prior art circuit implementation of the generalized logic circuit diagram of FIG. 1.
Figure 3:
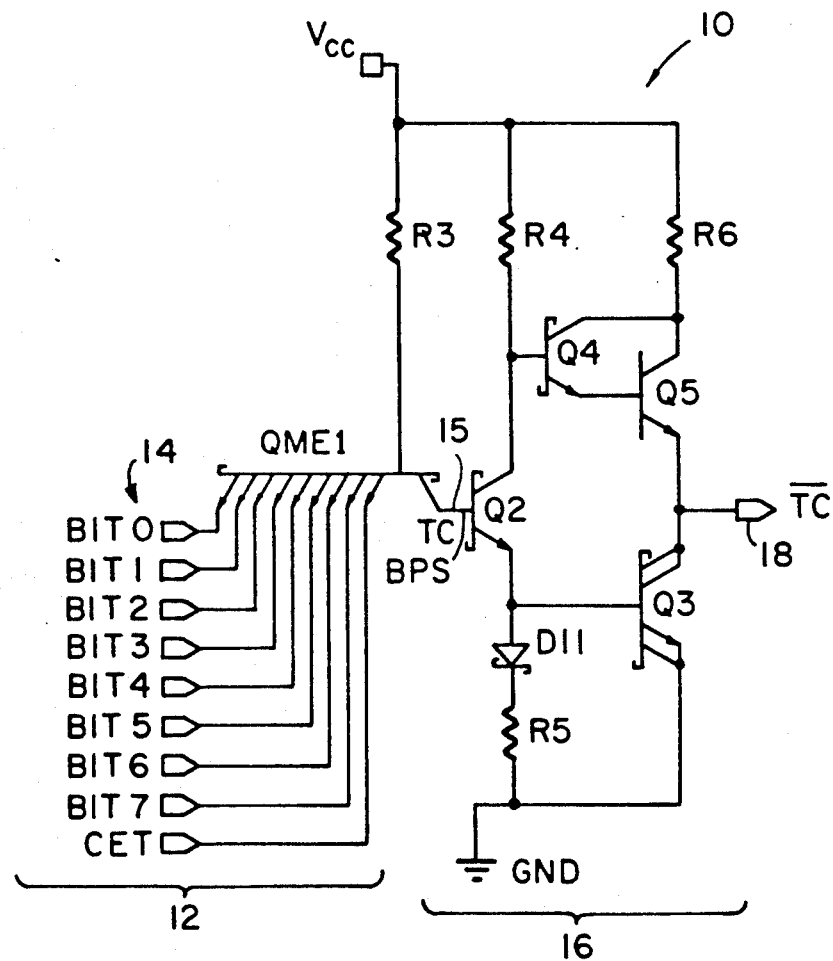
FIG. 3 is a detailed schematic circuit diagram of another prior art circuit implementation of the generalized logic circuit diagram of FIG. 1.
Figure 7:
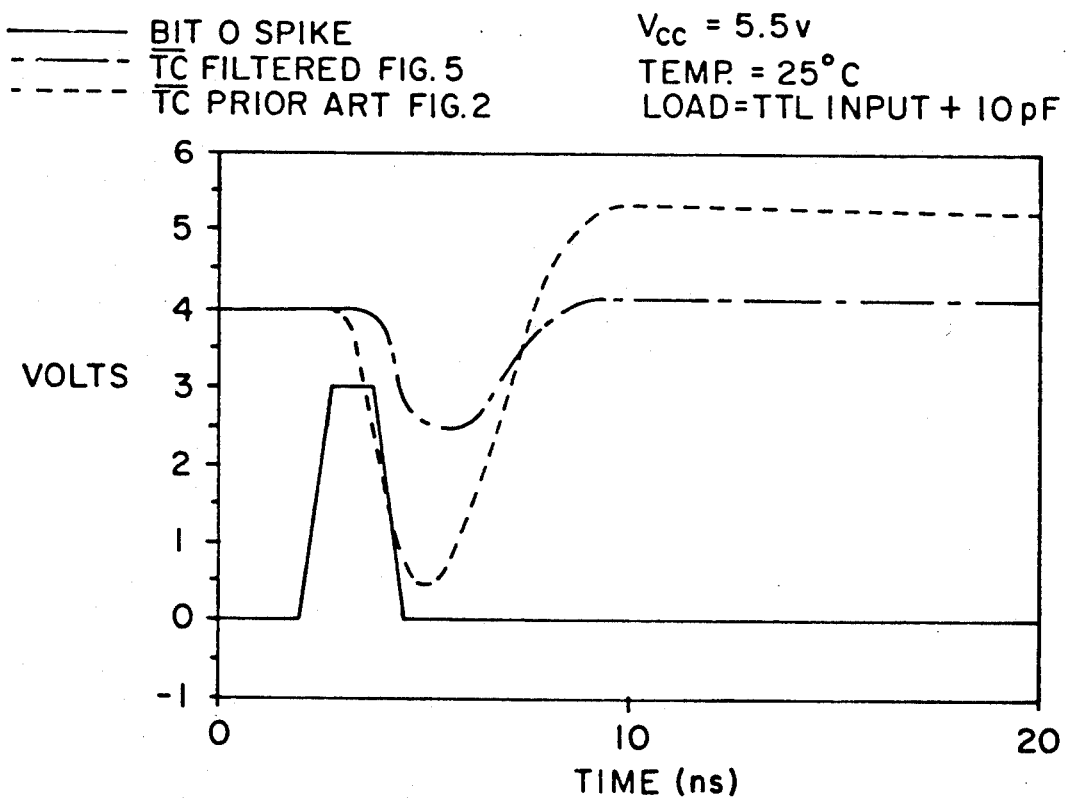
FIG. 7 is a graph comparing the unfiltered final terminal count signal $\overline{TC}$ from the prior art circuit of FIG. 2 with the filtered final terminal count signal $\overline{TC}$ from the circuit of FIG. 5.

In the graph of FIG. 7, the filtered final terminal count output signal TC from the circuit of FIG. 5 is compared with the unfiltered final terminal count output signal TC of the prior art circuit of FIG. 2. With the conditions specified in the graph, a high potential level is applied at all inputs of the respective circuits of FIG. 5 and FIG. 2 except for the BIT0 input which has a low potential level input signal. The final terminal count output signals TC would therefore normally be at the high potential level. A high potential level spike of, for example, 1-2nS duration is applied at the BIT0 input simulating a transient duration spurious concurrence condition or race condition at the input. As shown in the graph of FIG. 7, an unwanted decoding spike appears in the final terminal count signal $\overline{TC}$ at the final output 18 of the circuit of FIG. 2. The low voltage peak of the decoding spike is approximately 0.5 v, well below the logic high potential level specification of for example 2.0 v for the circuit. As a result a low potential level terminal count condition signal is received by other devices to which the circuit of FIG. 2 is coupled.

As shown in the graph of FIG. 7, however, a spurious noise spike at the first output 25 caused by the simulated race condition at the inputs 24 of the circuit of FIG. 5 cannot propagate past the barrier provided by delay circuit 30 and logical AND intermediate coupling 34. As a result the logic high potential level final terminal count signal TC at the final output 28 does not fall below the logic high potential level specification for the circuit of, for example, 2.0 v. It is apparent that spurious noise spikes need not be entirely filtered out and the plot of $\overline{TC}$ for the circuit of FIG. 5 shows a small dip. It is only necessary that the delay circuit 30 hold the phase splitter transistor element Q2 at a sufficiently low conducting state to prevent the high potential level at the final output 28 from falling below the high potential level circuit specification. While the final terminal count output signal $\overline{TC}$ may be completely smoothed out, this requires longer propagation delay.

Because the deglitched output $\overline{TC}$ from the circuits of FIGS. 4-6 remain above the specification for logic high potential level, the final terminal count output signal $\overline{TC}$ can be used to drive a synchronous devices such as counters and memories and also to activate edge triggered clock devices. With decoding spikes eliminated, the output circuit of the invention provides an unambiguous final terminal count signal TC during each count cycle. Furthermore, by varying the delay time interval of the delay circuit 30, a filtered "glitch-free" final terminal count signal TC can be assured for any application and for any combination of design parameters and process speed.

While the invention has been described with respect to positive AND logic circuit couplings, it is also applicable for negative NAND logic circuit couplings and the reference to AND logic in the specification and claims is intended to cover both variants; and the invention is intended to cover all modifications and equivalents within the scope of the following claims.

I claim:

1. An output circuit for a logical AND input circuit (22) having a plurality of inputs (24) including logic signal inputs (BIT0-BIT7) and a clock enable signal (CET), said logical AND input circuit having a first output (25) for delivering a first logic signal at the first output upon concurrence of input logic signals at said logic signal inputs with a clock enable signal at the clock enable signal input during a clock cycle, said output circuit comprising:

a delay circuit (30) coupled to the first output (25) and constructed to provide a second output (32) in parallel with the first output (25) for delivering a delayed second logic signal a selected delay time interval after the first logic signal;

a logical AND intermediate circuit coupling (34) having first and second input coupled respectively to said first and second outputs (25,32), said logical AND intermediate circuit coupling (34) providing a third output (35) for delivering a filtered third logic signal (TC) in response to first and second logic signals during a clock cycle;

a TTL output buffer circuit (26) having a phase splitter transistor element (Q2) with a base node (BPS);

said plurality of inputs (24) being coupled to the base node (BPS) of the phase splitter transistor element (Q2) to provide the first output (25) from the logical AND input circuit (22) and the first input to the logical AND intermediate circuit coupling (34);

said delay circuit (30) comprising first and second delay transistor elements (QD1, QD2) coupled in a double inversion transistor elements (QD1, QD2) coupled in a double inversion sequence between the plurality of inputs (24) and the base node (BPS) of the phase splitter transistor element (Q2) to provide the second output (32) and the second input to the logical AND intermediate circuit coupling (34);

said base node (BPS) of the phase splitter transistor element (Q2) comprising the logical AND intermediate circuit coupling (34) to provide the third output (35) delivering a filtered intermediate terminal count signal (TC) to the base node (BPS) of the phase splitter transistor element (Q2).

2. The output circuit of claim 1 wherein the output buffer circuit (26) comprises an inverting output buffer circut having an input (BPS) coupled to the third output (35) and providing a fourth output (28) for delivering an inverted fourth logic signal ($\overline{TC}$) in response to the filtered third logic signal (TC).

3. The output circuit of claim 1 wherein the delay circuit (30) comprises a first delay transistor element (QD10) coupled between the base node (BPS) of the phase splitter transistor element (Q2) and a low potential level power rail (GND() and a second delay transistor element (QD2) coupled between a base node of the first delay transistor element (QD1) and the low potential power rail (GND), a base node of the second delay transistor element (QD2) being coupled to the first output (25) of the logical AND input circuit (22).

4. The output circuit of claim 1 wherein the logical AND input circuit (22) comprises a first multiemitter transistor element (QME1) having multiple emitter leads coupled respectively to the plurality of inputs (24) and a collector node providing said first output (25), and a second multiemitter transistor element (QME2) having a multiple emitter leads coupled respectively to said plurality of inputs (24) and a collector node coupled to the delay circuit (30).

5. The output of claim 1 wherein the logical AND input circuit (22) and the output circuit comprise a flip flop circuit (FIG. 4, FIG. 5, FIG. 6) of a synchronous counter, wherein the logic signal inputs provide input logic signals comprising count logic signals, wherein the clock enable input provides a count enable clock signal for each of a clock cycle, wherein the third output provides a filtered intermediate terminal count signal (TC), and wherein the fourth output provides a final inverted terminal count signal ($\overline{TC}$) each clock cycle.

6. A synchronous counter flip flop circuit (20) comprising a logical AND input circuit (22) having a plurality of inputs (24) including count logic signal inputs (BIT0-BIT7) and a count enable clock signal input (CET), said logical AND input circuit having a first output (25) delivering a first count signal upon concurrence of count logic signals at said count logic signal inputs (BIT0-BIT7) with a count enable clock signal at the count enable clock signal input (CET) during a clock cycle, said flip flop circuit (20) further comprising an output buffer circuit (26) having an input (BPS) coupled to said first output (25) from the logical AND input circuit (22) and a terminal count output (28) providing a final terminal count signal (TC), the improvement comprising:

a count delay circuit (30) coupled to said first output (25) and constructed to provide a second output (32) in parallel with the first output (25) for delivering a delayed second count signal a selected time delay interval after the first count signal;

a logical AND intermediate circuit coupling (34) having first and second inputs coupled respectively to said first and second outputs (25,32) and providing a third output (35) for delivering a third count signal in the form of a filtered intermediate terminal count signal (TC) at the input (BPS) of the output buffer circuit (26);

and an inverting output buffer circuit (26) having a phase splitter transistor element (Q2), a base node (BPS) of the phase splitter transistor element (Q2) being coupled to said third output (35) for applying the filtered intermediate terminal count signal (TC) at the base node (BPS) of the phase splitter transistor element (Q2);

said count delay circuit (30) comprising a first delay transistor element (QD1) coupled between the base node (BPS) of the phase splitter transistor element (Q2) and a low potential level power rail (GND) and a second delay transistor element (QD2) coupled between a base node of the first delay transistor element (QD1) and the low potential power rail (GND), a base node of the second delay transistor element (QD2) being coupled to said first output (25).

7. The synchronous counter flip flop circuit (20) of claim 6 wherein the output buffer circuit (26) is an inverting output buffer circuit providing an inverted final terminal count signal ($\overline{TC}$) at the terminal count output (28).

8. The synchronous counter flip flop circuit of claim 6 wherein the logical AND input circuit (22) comprises a first multiemitter transistor element (QME1) having multiple emitter leads coupled respectively to the plurality of inputs (24) and a collector node providing said first output (25) and a second multiemitter transistor element (QME2) having multiple emitter leads coupled respectively to said plurality of inputs (24) and a collector node coupled to the count delay circuit (30).

* * * * *